(12) United States Patent
Hausman, Jr. et al.

(10) Patent No.: US 8,922,133 B2
(45) Date of Patent: Dec. 30, 2014

(54) SMART ELECTRONIC SWITCH FOR LOW-POWER LOADS

(75) Inventors: Donald F. Hausman, Jr., New Tripoli, PA (US); Miguel Aguado Pelaez, London (GB); Christopher James Salvestrini, Allentown, PA (US); Bingrui Yang, Mountain View, CA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 1049 days.

(21) Appl. No.: 12/751,324

(22) Filed: Mar. 31, 2010

(65) Prior Publication Data

US 2010/0270982 A1 Oct. 28, 2010

Related U.S. Application Data

(60) Provisional application No. 61/172,511, filed on Apr. 24, 2009, provisional application No. 61/226,990, filed on Jul. 20, 2009.

(51) Int. Cl.
| | | |
|---|---|---|
| *G05F 1/00* | (2006.01) | |
| *H05B 39/08* | (2006.01) | |
| *H03K 17/687* | (2006.01) | |
| *H05B 37/02* | (2006.01) | |
| *H02M 5/293* | (2006.01) | |
| *H03K 17/79* | (2006.01) | |
| *H02M 1/00* | (2006.01) | |

(52) U.S. Cl.
CPC .............. *H03K 17/79* (2013.01); *H05B 39/088* (2013.01); *H05B 39/081* (2013.01); *H03K 17/6874* (2013.01); *H05B 37/0227* (2013.01); *H05B 37/0218* (2013.01); *H02M 2001/0006* (2013.01); *Y02B 20/48* (2013.01); *H02M 5/293* (2013.01); *Y02B 20/46* (2013.01)
USPC ........... 315/291; 315/173; 315/240; 315/307; 323/237; 323/318

(58) Field of Classification Search
USPC .......................................................... 320/166
See application file for complete search history.

(56) References Cited

U.S. PATENT DOCUMENTS

| | | | |
|---|---|---|---|
| 5,365,154 A | 11/1994 | Schneider et al. | |
| 5,736,795 A | 4/1998 | Zuehlke | |

(Continued)

FOREIGN PATENT DOCUMENTS

| | | |
|---|---|---|
| CN | 1189715 A | 8/1998 |
| DE | 10132514 A1 | 1/2003 |
| WO | WO 2005114839 A1 | 12/2005 |

OTHER PUBLICATIONS

European Patent Office, International Search Report and Written Opinion for International Application No. PCT/US2010/031976, Oct. 4, 2010, 14 pages.

(Continued)

*Primary Examiner* — Edward Tso
*Assistant Examiner* — Johali Torres Ruiz
(74) *Attorney, Agent, or Firm* — Mark E. Rose; Philip N. Smith

(57) ABSTRACT

A two-wire smart load control device, such as an electronic switch, for controlling the power delivered from a power source to an electrical load comprises a relay for conducting a load current through the load, a controller for rendering the relay conductive and non-conductive, and an in-line power supply coupled in series with the relay for generating a supply voltage across a capacitor when the relay is conductive. The power supply controls when the capacitor charges asynchronously with respect to the frequency of the source. The capacitor conducts the load current for at least a portion of a line cycle of the source when the relay is conductive. The controller is operable to determine when the magnitude of the supply voltage reaches a maximum supply voltage threshold, and render the relay non-conductive immediately after the supply voltage reaches the maximum supply voltage threshold.

18 Claims, 10 Drawing Sheets

(56) References Cited

U.S. PATENT DOCUMENTS

| | | | |
|---|---|---|---|
| 5,754,036 A * | 5/1998 | Walker | 323/237 |
| 5,811,963 A * | 9/1998 | Elwell | 323/318 |
| 5,838,555 A | 11/1998 | Lejeune et al. | |
| 6,046,550 A * | 4/2000 | Ference et al. | 315/291 |
| 6,191,563 B1 * | 2/2001 | Bangerter | 323/211 |
| 6,262,565 B1 | 7/2001 | Williams et al. | |
| 6,396,672 B1 | 5/2002 | Deam | |
| 6,969,959 B2 | 11/2005 | Black et al. | |
| 7,012,518 B2 | 3/2006 | Novikov | |
| 7,190,124 B2 | 3/2007 | Kumar et al. | |
| 7,242,150 B2 | 7/2007 | DeJonge et al. | |
| 7,423,413 B2 | 9/2008 | Dobbins et al. | |
| 7,546,473 B2 | 6/2009 | Newman | |
| 7,564,227 B2 | 7/2009 | Dobbins et al. | |
| 7,573,208 B2 * | 8/2009 | Newman, Jr. | 315/294 |
| 7,728,564 B2 | 6/2010 | Fricke et al. | |
| 8,334,663 B2 | 12/2012 | Carmen | |
| 2007/0126366 A1 * | 6/2007 | Frid | 315/209 R |
| 2009/0009144 A1 * | 1/2009 | Hoshikawa et al. | 320/166 |
| 2009/0160409 A1 | 6/2009 | Carmen | |
| 2009/0273958 A1 | 11/2009 | Baby | |

OTHER PUBLICATIONS

U.S. Appl. No. 12/846,942, filed Jul. 30, 2010, Daniel F. Carmen.
Office Action and Search Report for corresponding Chinese Patent Application No. 201080018204.8, Aug. 23, 2013, 6 pages.
International Preliminary Report on Patentability for corresponding PCT Application No. PCT/US2010/031976, Jul. 26, 2011, 44 pages.

* cited by examiner

SMART ELECTRONIC SWITCH FOR LOW-POWER LOADS

CROSS-REFERENCE TO RELATED APPLICATIONS

This application is a non-provisional application of commonly-assigned U.S. Provisional Application Ser. No. 61/172,511, filed Apr. 24, 2009, entitled SMART LOAD CONTROL DEVICE HAVING A ZERO-CURRENT OFF STATE, and U.S. Provisional Application Ser. No. 61/226,990, filed Jul. 20, 2009, entitled SMART ELECTRONIC SWITCH FOR LOW-POWER LOADS, the entire disclosures of which are hereby incorporated by reference.

BACKGROUND OF THE INVENTION

1. Field of the Invention

The present invention relates to load control devices for control of the power delivered from an alternating-current (AC) power source to an electrical load, and more particularly, to a "smart" two-wire electronic switch having a controller, a latching relay, and a power supply that provides substantially all of the line voltage of the AC power source to the load and draws current through the load in a manner that does not result in inappropriate operation of the load.

2. Description of the Related Art

Typical load control devices are operable to control the amount of power delivered to an electrical load, such as a lighting load or a motor load, from an alternating-current (AC) power source. Wall-mounted load control devices are adapted to be mounted to standard electrical wallboxes. A dimmer switch comprises a controllably conductive device (e.g., a bidirectional semiconductor switch, such as, a triac), which is coupled in series between the power source and the load. The controllably conductive device is controlled to be conductive and non-conductive for portions of a half cycle of the AC power source to thus control the amount of power delivered to the load (e.g., using a phase-control dimming technique). A "smart" dimmer switch (i.e., a digital dimmer switch) comprises a microprocessor (or similar controller) for controlling the semiconductor switch and a power supply for powering the microprocessor. In addition, the smart dimmer switch may comprise a memory, a communication circuit, and a plurality of light-emitting diodes (LEDs) that are all powered by the power supply.

An electronic switch (i.e., a digital switch) comprises a controllably conductive device (such as a relay or a bidirectional semiconductor switch), a microprocessor, and a power supply. In contrast to a smart dimmer switch, the controllably conductive device of an electronic switch is not controlled using the phase-controlled dimming technique, but is controlled to be either conductive or non-conductive during each half cycle of the AC power source to thus toggle the electrical load on and off. Often, wall-mounted electronic switches do not require a connection to the neutral side of the AC power source (i.e., the electronic switch is a "two-wire" device). This is particularly useful when the electronic switch is installed in a retro-fit installation (i.e., to replace an existing switch or load control device in an electrical wallbox in which there is no neutral connection).

In order to charge, the power supply of a two-wire electronic switch must develop an amount of voltage across the power supply. As a result, not all of the AC line voltage of the AC power source is available to power the electrical load and the electrical load may not operate properly. For example, if the electrical load is a lighting load, the lighting load may not be illuminated to the maximum possible intensity. In addition, the power supply must draw current through the controlled electrical load in order to charge, which may cause problems for some types of electrical loads. For example, when the electrical load is a lighting load, the magnitude of the power supply current must not be great enough to cause the lighting load to illuminate or to flicker. Further, some electrical loads, such as compact fluorescent lamps, do not conduct sinusoidal currents, and as a result, current cannot be conducted through these electrical loads during certain portions of the line cycle of the AC power source.

Therefore, there exists a need for an electronic switch that has a controller for turning the load on and off and a single power supply that operates in a manner that does not result in inappropriate operation of the load.

SUMMARY OF THE INVENTION

As described herein, a two-wire electronic switch adapted to be coupled between an AC power source and an electrical load for turning the electrical load on and off may comprise a controllably conductive device adapted to be coupled in series electrical connection between the source and the load, a controller operatively coupled to the controllably conductive device for controlling the controllably conductive, an output capacitor operable to develop a DC supply voltage for powering the controller, and an in-line power supply that controls when the output capacitor charges asynchronously with respect to the frequency of the AC power source, such that the in-line power supply is operable to start and stop charging at any time during each half cycle. The controllably conductive device is adapted to conduct a load current through the load when the controllably conductive device is conductive. The controller renders the controllably conductive device conductive and non-conductive to turn the load on and off, respectively. The in-line power supply is coupled in series with the controllably conductive device, and further coupled to the output capacitor for controlling when the output capacitor charges in order to generate the DC supply voltage across the output capacitor when the controllably conductive device is conductive, such that the output capacitor stops charging when the magnitude of the DC supply voltage reaches a maximum DC supply voltage threshold. A voltage developed across the in-line power supply when the output capacitor is charging has a substantially small magnitude as compared to a peak voltage of an AC line voltage of the AC power source. The output capacitor is adapted to conduct the load current for at least a portion of a line cycle of the AC power source when the controllably conductive device is conductive. The output capacitor starts and stops charging the output capacitor at least once during each half cycle of the AC power source. The controller is operable to determine when the magnitude of the DC supply voltage reaches the maximum DC supply voltage threshold, and to render the controllably conductive device non-conductive immediately after the DC supply voltage reaches the maximum DC supply voltage threshold.

Further a two-wire electronic switch for controlling the power delivered from an AC power source to an electrical load may comprise a latching relay adapted to be coupled in series electrical connection between the source and the load for turning the load on and off, an output capacitor operable to develop a DC supply voltage, an in-line power supply, and a controller operable to determine when the magnitude of the DC supply voltage reaches a maximum DC supply voltage threshold, and to render the relay non-conductive immediately after the DC supply voltage reaches the maximum DC supply voltage threshold. The in-line power supply is coupled in series electrical connection with the relay, and further coupled to the output capacitor for generating the DC supply voltage across the output capacitor when the relay is conductive. The power supply comprises a bidirectional semiconductor switch coupled in series with the relay and in parallel with the output capacitor, such that the output capacitor is operable to charge when the relay is conductive and the bidirectional semiconductor switch is non conductive. The bidirectional semiconductor switch is rendered conductive when the magnitude of the DC supply voltage reaches the maximum DC supply voltage threshold and rendered non-conductive when the magnitude of the DC supply voltage drops to a minimum DC supply voltage threshold. The output capacitor is adapted to conduct the load current for at least a portion of a line cycle of the AC power source when the relay is conductive.

Other features and advantages of the present invention will become apparent from the following description of the invention that refers to the accompanying drawings.

BRIEF DESCRIPTION OF THE DRAWINGS

The invention will now be described in greater detail in the following detailed description with reference to the drawings in which.

DETAILED DESCRIPTION OF THE INVENTION

Figure 1:
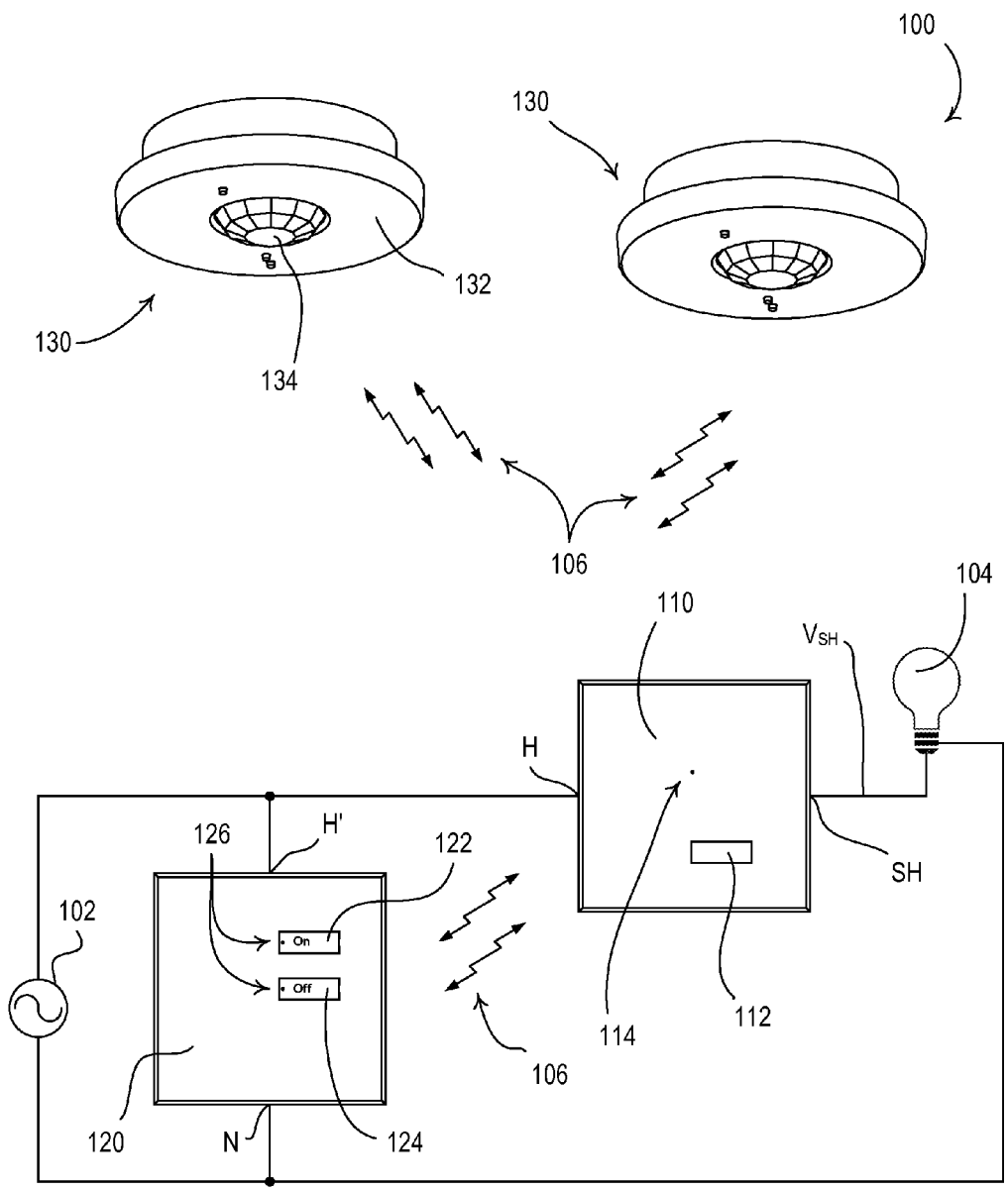
FIG. 1 is a simplified diagram of a radio-frequency (RF) lighting control system comprising a two-wire electronic switch and two remote vacancy sensors according to a first embodiment of the present invention.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

FIG. 1 is a simple diagram of a radio-frequency (RF) lighting control system 100 comprising a two-wire electronic switch 110, a keypad 120, and two remote occupancy sensors 130 according to a first embodiment of the present invention. The electronic switch 110 and the keypad 120 are adapted to be wall-mounted in standard electrical wallboxes. Alternatively, the electronic switch 110 and the keypad 120 could be implemented as table-top control devices. In addition, the electronic switch 110 may comprise a controllable plug-in module adapted to be plugged into an electrical receptacle or a controllable screw-in module adapted to be screwed into the electrical socket (e.g., an Edison socket) of a lamp.

The electronic switch 110 comprises a hot terminal H and a switched hot terminal SH and is adapted to be coupled in series electrical connection between an AC power source 102 (e.g., 120 $V_{AC}$ @60 Hz or 240 $V_{AC}$ @50 Hz) and a lighting load 104 for controlling the power delivered to the lighting load. The electronic switch 110 generates a switched hot voltage $V_{SH}$ at the switched hot terminal SH. The electronic switch 110 comprises a control actuator 112 (i.e., a control button) for toggling (i.e., turning off and on) the lighting load 104, and a visual indicator 114 for providing feedback of whether the lighting load is on or off. The electronic switch 110 is also operable to turn the lighting load 104 off in response to digital messages received from the keypad 120 and the occupancy sensors 130 via RF signals 106.

The keypad 120 is coupled to the hot and neutral connections of the AC power source 102 via a hot terminal H' and a neutral terminal N, respectively. The keypad 120 comprises an on button 122 and an off button 124 for turning the lighting load 104 on and off, respectively. The keypad 120 is operable to transmit a digital message including an "on" command to the electronic switch 110 in response to an actuation of the on button 122, and to transmit a digital message including an "off" command to the electronic switch in response to an actuation of the off button 124. The keypad 120 further comprises visual indicators 126 provided on the button 122, 124 for providing feedback of whether the lighting load 104 is on or off.

The occupancy sensors 130 are removably mountable to a ceiling or a wall, for example, in the vicinity of (i.e., a space around) the lighting load 104 controlled by the electronic switch 110. The occupancy sensors 130 are operable to detect the presence of an occupant in the space (i.e., an occupancy condition) and the absence of the occupancy (i.e., a vacancy condition) in the vicinity of the lighting load 104. The occupancy sensors 130 may be spaced apart to detect occupancy conditions in different areas of the vicinity of the lighting load 104. The occupancy sensors 130 and the electronic switch 110 operate to turn on the lighting load when one of the occupancy sensors detects that an occupant has entered the space (i.e., at least one sensor detects an occupancy condition) and then to turn off the lighting load when both occupancy sensors detect that the user has left the space (i.e., both sensors detect vacancy conditions).

Alternatively, the occupancy sensors 130 could be implemented as vacancy sensors. A vacancy sensor only operates to turn off the lighting load 104 when the vacancy sensor detects a vacancy in the space. Therefore, when using vacancy sensors, the lighting load 104 must be turned on manually (e.g., in response to a manual actuation of the control actuator 112). Examples of wireless battery-powered occupancy sensors are described in greater detail in U.S. patent application Ser. No. 12/203,500, filed Sep. 3, 2008, entitled BATTERY-POWERED OCCUPANCY SENSOR, the entire disclosure of which is hereby incorporated by reference.

The occupancy sensors 130 each include an internal detector (not shown), e.g., a pyroelectric infrared (PIR) detector. The internal detector is housed in an enclosure 132, which has a lens 134 for directing infrared energy from an occupant in the space to the internal detector for sensing the occupancy condition in the space. The occupancy sensors 130 are operable to process the output of the internal detector to determine whether an occupancy condition or a vacancy condition is presently occurring in the space, for example, by comparing the output of the PIR detector to a predetermined occupancy voltage threshold. Alternatively, the internal detector could comprise an ultrasonic detector, a microwave detector, or any combination of PIR detectors, ultrasonic detectors, and microwave detectors. The occupancy sensors 130 each operate in an "occupied" state or a "vacant" state in response to the detections of occupancy or vacancy conditions, respectively, in the space. If one of the occupancy sensors 130 is in the vacant state and the occupancy sensor determines that the space is occupied, the occupancy sensor changes to the occupied state. Similarly, the occupancy sensor 130 changes to the vacant state, if the occupancy sensor is in the occupied state and the occupancy sensor determines that the space is unoccupied.

During a setup procedure of the RF lighting control system 100, the electronic switch 110 and the keypad 120 may be assigned to (i.e., associated with) the occupancy sensors 130. The setup and configuration of a lighting control system including occupancy sensors is described in greater detail in U.S. patent application Ser. No. 12/371,027, filed Feb. 13, 2009, entitled METHOD AND APPARATUS FOR CONFIGURING A WIRELESS SENSOR, the entire disclosure of which is hereby incorporated by reference.

The occupancy sensors 130 transmit digital messages wirelessly via the RF signals 106 in response to the present state of the occupancy sensors (i.e., whether an occupancy condition or a vacancy condition has been detected). The electronic switch 110 turns the lighting load 104 on and off in response to the digital messages received via the RF signals 106. A digital message transmitted by the remote occupancy sensors 130 may include a command and identifying information, for example, a serial number associated with the transmitting occupancy sensor. The electronic switch 110 is responsive to messages containing the serial numbers of the remote occupancy sensors 130 to which the electronic switch is assigned. The operation of the RF lighting control system 100 is described in greater detail in U.S. patent application Ser. No. 12/203,518, filed Sep. 3, 2008, entitled RADIO-FREQUENCY LIGHTING CONTROL SYSTEM WITH OCCUPANCY SENSING, the entire disclosure of which is hereby incorporated by reference.

The commands included in the digital messages transmitted by the occupancy sensors 130 may comprise an occupied command (e.g., an occupied-take-action command or an occupied-no-action command) or a vacant command. When the lighting load 104 is off, the electronic switch 110 is operable to turn on the lighting load in response to receiving a first occupied-take-action command from any one of the occupancy sensors 130. The electronic switch 110 is operable to turn off the lighting load 104 in response to the last vacant command received from those occupancy sensors 130 from which the occupancy sensor received either occupied-take-action or occupied-no-action commands. For example, if the occupancy sensors 130 both transmit occupied-take-action commands to the electronic switch 110, the electronic switch will not turn off the lighting load 104 until subsequent vacant commands are received from both of the occupancy sensors.

Each occupancy sensor 130 also comprises an internal ambient light detector (not shown), e.g., a photocell, for detecting the level of ambient light around the occupancy sensor. The occupancy sensor 130 measures the ambient light level when an occupancy condition is first detected and compares the ambient light level to a predetermined ambient light level threshold. If the measured ambient light level is less than the predetermined level when an occupancy condition is first detected by one of the occupancy sensors 130, the occupancy sensor transmits the occupied-take-action command to the electronic switch 110. On the other hand, if the measured ambient light level is greater than the predetermined level when an occupancy condition is first detected, the occupancy sensor 130 transmits the occupied-no-action command to the electronic switch 110. Accordingly, the electronic switch 110 does not turn on the lighting load 104 if the ambient light level in the space is sufficient.

The occupancy sensors 130 are each characterized by a predetermined occupancy sensor timeout period $T_{TIMEOUT}$, which provides some delay in the adjustment of the state of the occupancy sensor, specifically, in the transition from the occupied state to the vacant state. The predetermined timeout period $T_{TIMEOUT}$ denotes the time between the last detected occupancy condition and the transition of the occupancy sensor 130 from the occupied state to the vacant state. The predetermined occupancy sensor timeout period $T_{TIMEOUT}$ may be user-selectable, for example, ranging from approximately five to thirty minutes. Each occupancy sensor 130 will not transmit a vacant command until the occupancy sensor timeout period $T_{TIMEOUT}$ has expired. Each occupancy sensor 130 maintains an occupancy timer to keep track of the time that has expired since the last detected occupancy condition. The occupancy sensors 130 periodically restart the occupancy timers in response to detecting a continued occupancy condition. Accordingly, the occupancy sensors 130 do not change to the vacant state, and the lighting load 104 is not turned off, in response to brief periods of a lack of movement of the occupant in the space. If the occupancy sensor 130 fails to continue detecting the occupancy conditions, the occupancy sensor uses the occupancy timer to wait for the length of the occupancy sensor timeout period $T_{TIMEOUT}$, after which the occupancy sensor changes to the vacant state and transmits a vacant command to the electronic switch 110.

Figure 2:
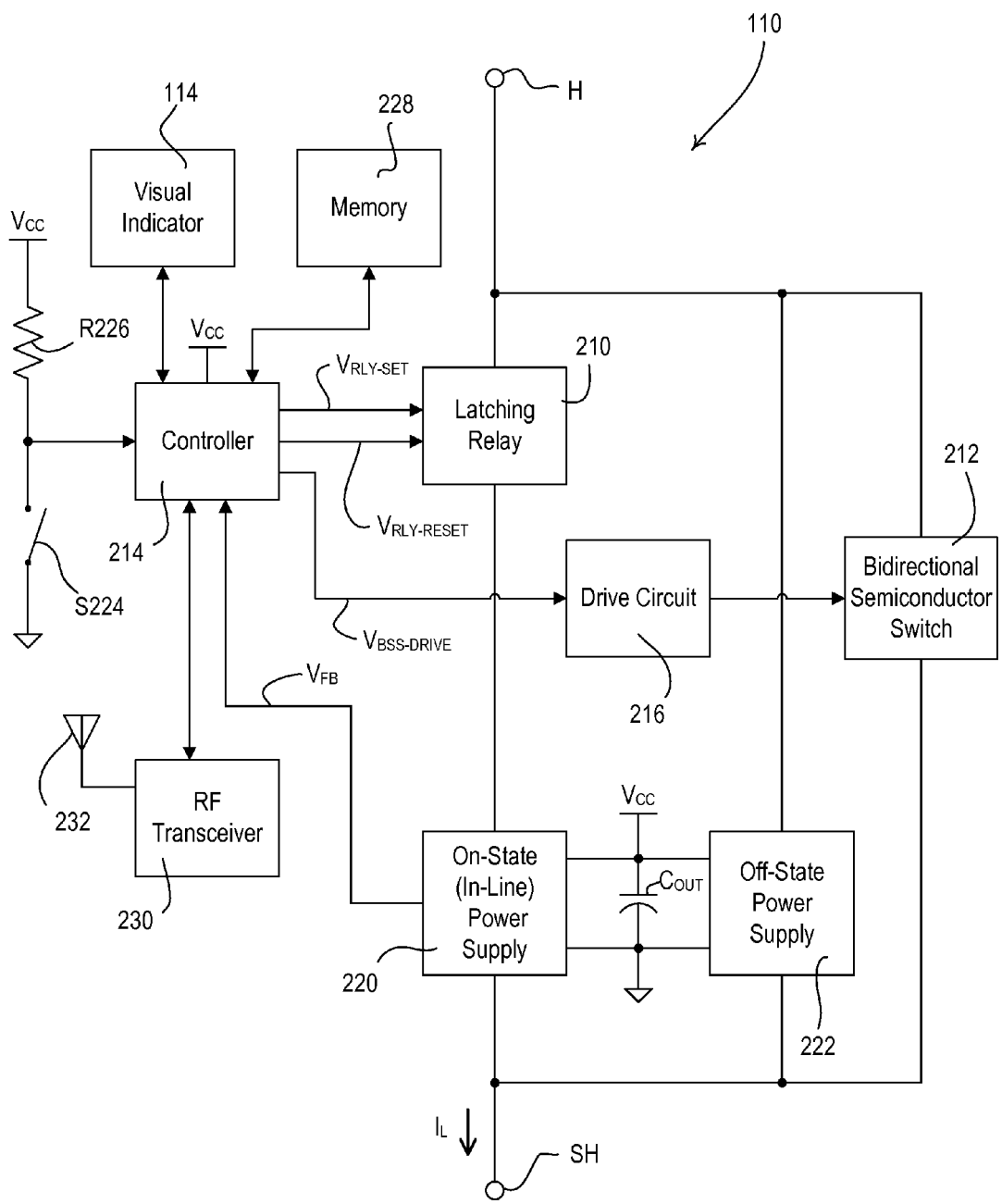
FIG. 2 is a simplified block diagram of the two-wire electronic switch of FIG. 1.

FIG. 2 is a simplified block diagram of the electronic switch 110. The electronic switch 110 comprises a controllably conductive device (e.g., a latching relay 210) connected in series electrical connection between the hot terminal H and the switched hot terminal SH. The relay 210 conducts a load current $I_L$ from the AC power source 102 to the lighting load 104 when the relay is closed (i.e., conductive). The load current $I_L$ may have, for example, a magnitude of approximately five amps depending upon the type of lighting load 104. The electronic switch 110 further comprises a bidirectional semiconductor switch 212 coupled in parallel electrical connection with the relay 210 for minimizing the inrush current conducted through the relay 210 (and thus limiting any arcing that may occur at the contacts of the relay) when the lighting load 104 is first turned on. Specifically, the bidirectional semiconductor switch 212 is controlled to be conductive before the relay 210 is rendered conductive when the electronic switch 110 is turning on the lighting load 104, and is controlled to be non-conductive after the relay is rendered non-conductive when the electronic switch is turning of the lighting load. The bidirectional semiconductor switch 212 may comprise, for example, a triac, a field-effect transistor (FET) in a rectifier bridge, two FETs in anti-series connection, one or more silicon-controlled rectifiers (SCRs), one or more insulated-gate bipolar junction transistors (IGBTs), or any other suitable type of bidirectional semiconductor switch.

The relay 210 and the bidirectional semiconductor switch 212 are independently controlled by a controller 214. For example, the controller 214 may be a microcontroller, but may alternatively be any suitable processing device, such as a programmable logic device (PLD), a microprocessor, an application specific integrated circuit (ASIC), or a field-programmable gate array (FPGA). The controller 214 is coupled to SET and RESET terminals (e.g., SET and RESET coils) of the relay 210 for causing the relay to become conductive and non-conductive, respectively. Specifically, the controller 214 generates a relay-set control signal $V_{RLY\text{-}SET}$ for driving the SET coil and a relay-reset control signal $V_{RLY\text{-}RESET}$ for driving the RESET coil. The controller 214 also provides a BSS-drive control signal $V_{RLY\text{-}DRIVE}$ to the a control input of the bidirectional semiconductor switch 212 via a gate drive circuit 216 for rendering the bidirectional semiconductor switch conductive.

The electronic switch 110 comprises two power supplies: an on-state (in-line) power supply 220 and an off-state power supply 222. Both power supplies 220, 222 operate to generate a DC supply voltage $V_{CC}$ (e.g., having an average magnitude of approximately five volts) across an output capacitor $C_{OUT}$ (e.g., having a capacitance of approximately 680 µF). The controller 214 and other low-voltage circuitry of the electronic switch 110 are powered from the DC supply voltage $V_{CC}$. The bidirectional semiconductor switch 212 is coupled in series electrical connection with the parallel combination of the relay 210 and the on-state power supply 220. The on-state power supply 220 operates to generate the DC supply voltage $V_{CC}$ when the relay 210 is closed and the lighting load 104 is on as will be described in greater detail below. The off-state power supply 222 is coupled in parallel electrical connection with the relay 210 and the bidirectional semiconductor switch 212 and operates to generate the DC supply voltage $V_{CC}$ when the relay 210 is open and the lighting load 104 is off. Since the output capacitor $C_{OUT}$ is referenced to the circuit common of the on-state power supply 220, the off-state power supply 222 may comprise an isolated power supply.

The controller 214 receives inputs from a momentary tactile (i.e., mechanical) switch S224, which temporarily closes in response to actuations of the control actuator 112 of the electronic switch 110. The series combination of the switch S224 and a resistor 8226 (e.g., having a resistance of approximately 15 kΩ) is coupled between the DC supply voltage $V_{CC}$ and the circuit common. When the control actuator 112 is actuated and the switch 5224 is temporarily closed, the input port of the controller 214 is pulled down towards circuit common, thus signaling to the controller 214 that the switch S224 has been actuated. Accordingly, the controller 214 is operable to control the relay 210 and the bidirectional semiconductor switch 212 to toggle the lighting load 104 on and off in response to actuations of the switch S224. The controller 214 is further operable to control the visual indicator 114 to be illuminated when the lighting load 104 is on and not illuminated when the lighting load is off.

The controller 214 is also coupled to a memory 228 for storage of the serial number of the keypad 120 and the occupancy sensors 130 to which the electronic switch 110 is assigned. The memory 228 may be implemented as an external integrated circuit (IC) or as an internal circuit of the controller 214. The electronic switch 110 further comprises an RF transceiver 230 and an antenna 232 for transmitting and receiving the RF signals 106 with the keypad 120 and the occupancy sensors 130. The controller 214 is operable to control the relay 210 and the bidirectional semiconductor switch 212 in response to the digital messages received via the RF signals 106. Examples of the antenna 232 for wall-mounted load control devices, such as the electronic switch 110, are described in greater detail in U.S. Pat. No. 5,982,103, issued Nov. 9, 1999, and U.S. patent application Ser. No. 10/873,033, filed Jun. 21, 2006, both entitled COMPACT RADIO FREQUENCY TRANSMITTING AND RECEIVING ANTENNA AND CONTROL DEVICE EMPLOYING SAME, the entire disclosures of which are hereby incorporated by reference.

Alternatively, the electronic switch 110 could simply comprise an RF receiver for only receiving digital messages from the keypad 120 and the occupancy sensors 130 via the RF signals 106. In addition, the electronic switch 110 could alternatively comprise an infrared (IR) receiver for receipt of IR signals, a wired communication circuit for connection to a wired communication link, a power-line carrier (PLC) communication circuit, or another type of communication circuit. Examples of lighting control system including other types of communication circuits are described in greater detail in U.S. Pat. No. 6,545,434, issued Apr. 8, 2003, entitled MULTI-SCENE PRESET LIGHTING CONTROLLER; U.S. Pat. No. 7,423,413, issued Sep. 8, 2009, entitled POWER SUPPLY FOR A LOAD CONTROL DEVICE; and U.S. patent application Ser. No. 11/447,431, filed Jun. 6, 2006, entitled SYSTEM FOR CONTROL OF LIGHTS AND MOTORS; the entire disclosures of which are hereby incorporated by reference.

The on-state power supply 220 generates the DC supply voltage $V_{CC}$ while allowing the electronic switch 110 to provide substantially all of the AC line voltage to the lighting load 104 when the lighting load is on. When the output capacitor $C_{OUT}$ is charging through the on-state power supply 220 (while the relay 210 is conductive), the voltage developed across the on-state power supply has a substantially small magnitude (e.g., approximately the DC supply voltage $V_{CC}$, i.e., approximately five volts) as compared to the peak voltage of the AC line voltage of the AC power source 102. In other words, the on-state power supply 220 imposes a substantially low voltage drop as compared to the peak voltage of the AC line voltage of the AC power source 102, such that the voltage provided to the lighting load 104 (i.e., switched hot voltage $V_{SH}$) is only slightly smaller when the output capacitor $C_{OUT}$ is charging. For example, the peak voltage of the AC line voltage is approximately 340 volts when the RMS voltage of the AC power source 102 is 240 $V_{AC}$, while the voltage developed across the on-state power supply 220 is equal to approximately the DC supply voltage $V_{CC}$ (i.e., approximately five volts) for only a portion of each half cycle of the AC power source 102.

The on-state power supply 220 conducts a charging current $I_{CHRG}$ (FIG. 3) through the output capacitor $C_{OUT}$ for charging the output capacitor. The output capacitor $C_{OUT}$ is adapted to conduct the load current $I_L$ for at least a portion of a line cycle of the AC power source 102 when the relay is conductive. Accordingly, the charging current $I_{CHRG}$ is equal to the load current $I_L$ for at least a portion of a line cycle of the AC power source 102 when the relay is conductive. The on-state power supply 220 is able to operate properly when the lighting load 104 is a low-power load, e.g., having a power rating down to approximately 25 W (and a voltage rating of 240 $V_{AC}$). In other words, the on-state power supply 220 is operable to appropriately charge the output capacitor $C_{OUT}$ to keep the controller 214 powered when the load current $I_L$ has a magnitude as low as approximately 100 mA.

Since the lighting load 104 may cause the load current $I_L$ of the on-state power supply 220 to be a non-sinusoidal current (e.g., if the lighting load is a compact fluorescent lamp), the output capacitor $C_{OUT}$ may not be able to conduct the charging current $I_{CHRG}$ through the lighting load during certain portions of the line cycle of the AC power source 102. Accordingly, the on-state power supply 220 controls when the output capacitor $C_{OUT}$ is able to charge in a manner that is asynchronous with respect to the frequency of the AC line voltage of the AC power source 102, such that the power supply is operable to start and stop charging at any time during each half cycle (i.e., at any time between the beginning and the end of the half cycle). Specifically, the on-state power supply 220 is operable to begin charging the output capacitor $C_{OUT}$ when the magnitude of the DC supply voltage $V_{CC}$ drops to a minimum supply voltage $V_{CC-MIN}$ (e.g., approximately five volts). However, the output capacitor $C_{OUT}$ may not begin charging until the output capacitor $C_{OUT}$ is able to conduct the load current $I_L$ through the lighting load 104 (i.e., if the load current $I_L$ is non-sinusoidal). The on-state power supply 220 always stops charging when the magnitude of the DC supply voltage rises to a maximum supply voltage $V_{CC-MAX}$ (e.g., approximately six volts). When the lighting load 104 is a resistive load, such as an incandescent lamp (i.e., the load current $I_L$ is sinusoidal), the charging current $I_{CHRG}$ of the on-state power supply 220 may be asynchronous with respect to the frequency of the AC line voltage (as shown FIG. 4A). Alternatively, if the lighting load 104 conducts a non-sinusoidal load current $I_L$, the charging current $I_{CHRG}$ may be synchronous with respect to the line voltage frequency (as shown in FIG. 4B).

In order to minimize visible flickering in the lighting load 104, the on-state power supply 220 draws current from the AC power source 102 at least once every half cycle of the AC power source 102. Accordingly, the time period between any two consecutive pulses of the charging current $I_{CHRG}$ is less than the period $T_{HC}$ of a half cycle (e.g., approximately ten milliseconds for a 50-Hz power source), and thus the frequency of the pulses of the charging current $I_{CHRG}$ is greater than the twice the line voltage frequency (e.g., approximately 100 Hz), so as avoid visible flickering in the lighting load 104. The time period between any two consecutive pulses of the charging current $I_{CHRG}$ may be approximately equal to the period $T_{HC}$ of a half cycle if the charging current $I_{CHRG}$ is synchronous with respect to the line voltage frequency (as shown in FIG. 4B).

The controller 214 is operable to monitor the operation of the on-state power supply 220 in order to determine the appropriate times to perform actions that require larger amounts of current to be drawn from the output capacitor $C_{OUT}$, such as energizing the coils of the relay 210. The on-state power supply 220 provides to the controller 214 a feedback control signal $V_{FB}$, which is representative of whether the output capacitor $C_{OUT}$ is charging or not as will be described in greater detail below. The controller 214 may be operable to energize the SET and RESET coils of the relay 210 immediately after the output capacitor $C_{OUT}$ stops charging, i.e., when the magnitude of the DC supply voltage $V_{CC}$ is equal to the maximum supply voltage $V_{CC-MAX}$ and the maximum amount of voltage is available to energize the coils.

Figure 3:
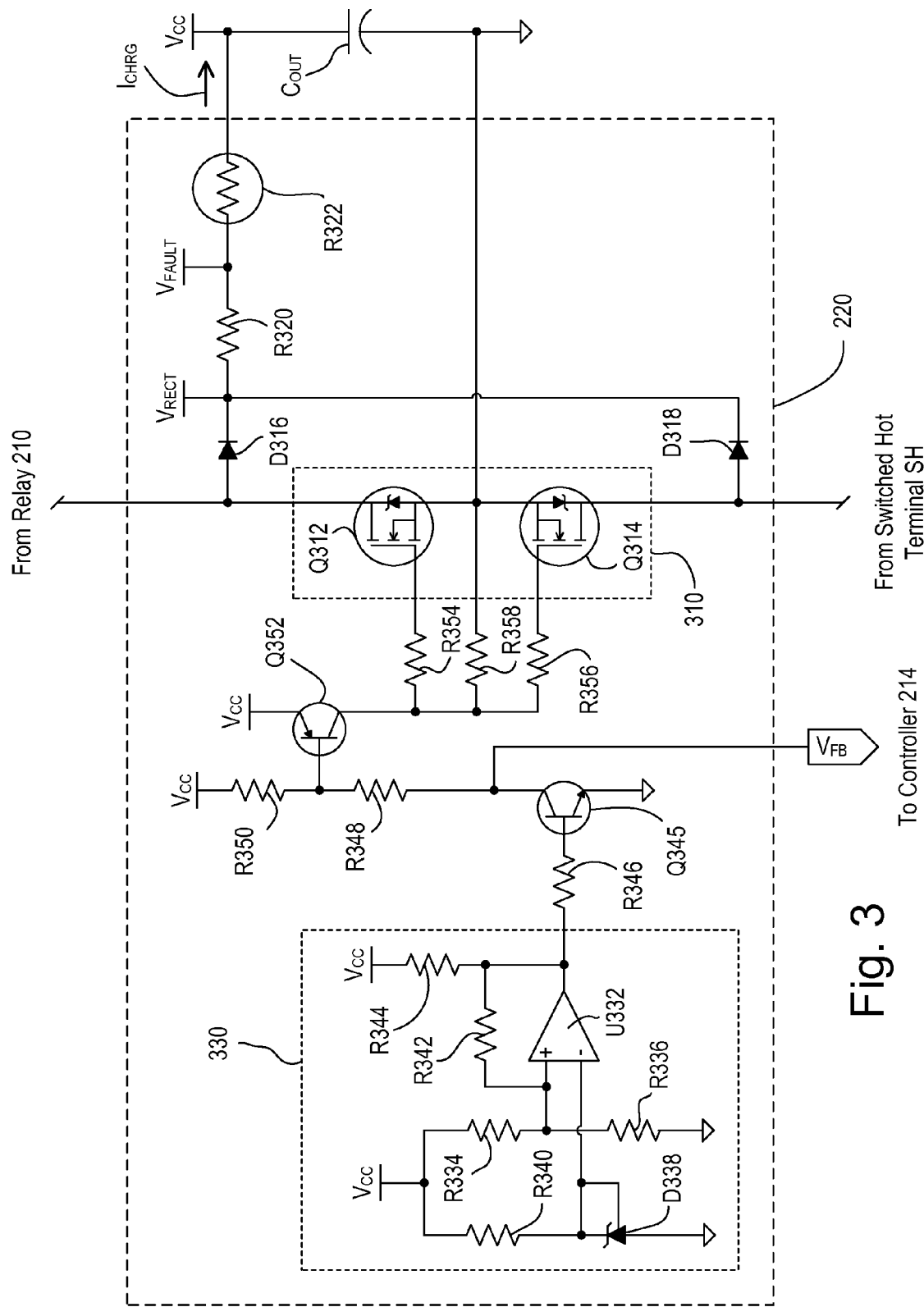
FIG. 3 is a simplified schematic diagram of an in-line on-state power supply of the two-wire electronic switch of FIG. 2.

FIG. 3 is a simplified schematic diagram of the in-line power supply 220 according to the first embodiment of the present invention. The on-state power supply 220 includes a bidirectional semiconductor switch 310 comprising, for example, two FETs Q312, Q314 coupled in anti-series connection. The on-state power supply 220 also comprises a full-wave rectifier bridge that includes the body diodes of the two FETs Q312, Q314 in addition to two diodes D316, D318, which are all coupled to the output capacitor $C_{OUT}$, for allowing the output capacitor to charge from the AC power source 102 through the lighting load 104. The rectifier bridge has AC terminals coupled in series between the switched hot terminal SH and the relay 210, and DC terminals for providing a rectified voltage $V_{RECT}$. The output capacitor $C_{OUT}$ is coupled in series between the DC terminals of the rectifier bridge, such that the output capacitor is able to charge from the AC power source 102 through the rectifier bridge and the lighting load 104. The anti-series-connected FETs Q312, Q314 are coupled in parallel electrical connection with the AC terminals of the rectifier bridge, such that the FETs are operable to conduct the load current $I_L$ from the AC power source 102 to the lighting load 104 when the FETs are conductive, and the output capacitor $C_{OUT}$ is operable to conduct the load current $I_L$ when the FETs are non-conductive.

The output capacitor $C_{OUT}$ is also coupled in series with an over-current detect resistor R320 (e.g., having a resistance of approximately 0.1Ω) and a positive-temperature-coefficient (PTC) thermistor R322, which allow for the detection of fault conditions (e.g., an over-current or an over-temperature condition in the electronic switch 110), as will be described in greater detail below with reference to FIG. 5. For example, the PTC thermistor R322 may comprise part number B59807A0090A062, manufactured by EPCOS, Inc., which has a maximum nominal resistance of approximately 400Ω. A fault voltage $V_{FAULT}$ is generated across the series combination of the PTC thermistor R322 and the output capacitor $C_{OUT}$ and has a magnitude approximately equal to the magnitude of the DC supply voltage $V_{CC}$ during normal operating conditions (i.e., in absence of a fault condition).

The on-state power supply 220 comprises a control circuit 330, which operates, during normal operation, to render the FETs Q312, Q314 non-conductive to temporarily and briefly block the load current $I_L$. This allows the output capacitor $C_{OUT}$ to conduct the load current $I_L$ and to thus charge for at least a portion of a line cycle of the AC power source 102 when the relay 210 in conductive. Accordingly, the magnitude of the DC supply voltage $V_{CC}$ increases when the bidirectional semiconductor switch 310 is non-conductive and decreases when the bidirectional semiconductor switch is conductive. Specifically, the control circuit 330 renders the FETs Q312, Q314 non-conductive when the magnitude of the DC supply voltage $V_{CC}$ drops to the minimum supply voltage $V_{CC-MIN}$ (i.e., approximately five volts) and renders the FETs conductive when the magnitude of the DC supply voltage $V_{CC}$ rises to the maximum supply voltage $V_{CC-MAX}$ (i.e., approximately six volts).

The control circuit 330 of the on-state power supply 260 comprises, for example, an analog circuit having a comparator U332 for controlling when the FETs Q312, Q314 are conductive in response to the magnitude of the DC supply voltage $V_{CC}$. A resistor divider comprising two resistors R334, R336 is coupled between the DC supply voltage $V_{CC}$ and circuit common and provides a scaled voltage that is representative of the magnitude of the DC supply voltage $V_{CC}$ to the positive terminal of the comparator U332. The resistors R334, R336 may have, for example, resistances of approximately 40.2 kΩ and 11 kΩ, respectively.

The control circuit 330 comprises a shunt regulator D338 (e.g., part number TLV431 manufactured by Texas Instruments) having a cathode connected to the DC supply voltage $V_{CC}$ through a resistor R340 (e.g., having a resistance of approximately 11 kΩ). The cathode of the shunt regulator D338 is coupled to the reference terminal of the shunt regulator and to the negative terminal of the comparator U332, such that a fixed reference voltage (e.g., approximately 1.24 V) is provided at the negative terminal. A resistor R342 (e.g., having a resistance of approximately 47 kΩ) is coupled between the positive terminal and the output terminal of the comparator U332 for providing some hysteresis in the operation of the on-state power supply 220. The output of the comparator U332 is pulled up to the DC supply voltage $V_{CC}$ through a resistor R344 (e.g., having a resistance of approximately 11 kΩ). When the scaled voltage at the positive terminal of the comparator U332 is less than the fixed reference voltage (i.e., 1.24 V) at the negative terminal of the comparator, the output terminal of the comparator U332 is driven low, so as to render the FETs Q312, Q314 non-conductive as will be described below. Alternatively, the control circuit 330 of the on-state power supply 220 could comprise a digital circuit that includes, for example, a microprocessor, a PLD, an ASIC, an FPGA, or other suitable type of integrated circuit. The comparator U332 may comprise part number LM2903 manufactured by National Semiconductor Corporation.

The output of the comparator U332 is coupled to the base of an NPN bipolar junction transistor Q345 via a resistor R346 (e.g., having a resistance of approximately 22 kΩ). The collector of the transistor Q345 is coupled to the DC supply voltage $V_{CC}$ via two resistors Q348, Q350 (e.g., having resistances of 100 kΩ and 22 kΩ, respectively). The base of a PNP bipolar junction transistor Q352 is coupled to the junction of the two resistors Q348, Q350. The collector of the transistor Q352 is coupled to the gates of the FETs Q312, Q314 via two respective gate resistors R354, R356 (e.g., both having a resistance of approximately 8.2 kΩ). When the output terminal of the comparator U332 is pulled high towards the DC supply voltage $V_{CC}$, the transistors Q345, Q352 are both rendered conductive. Accordingly, the DC supply voltage $V_{CC}$ is coupled to the gates of the FETs Q312, Q314 via the respective gate resistors R354, R356, thus rendering the FETs conductive. When the output terminal of the comparator U332 is driven low (i.e., approximately at circuit common) and the transistors Q345, Q352 are rendered non-conductive, the gate capacitances of the gates of the FETs discharge through a resistor R358 (e.g., having a resistance of approximately 8.2 kΩ) and the FETs are rendered non-conductive.

Figure 4A:
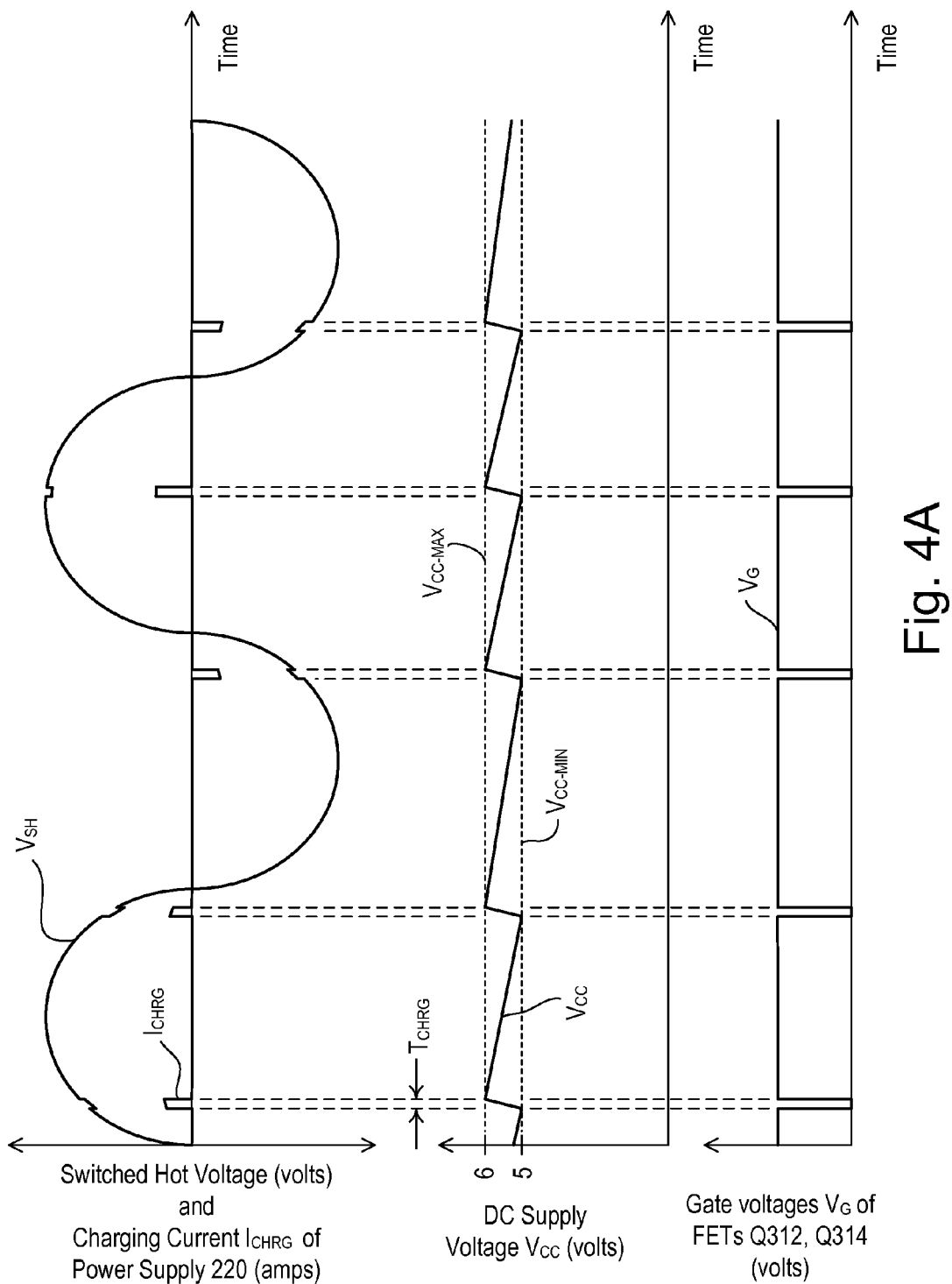
FIG. 4A is a simplified diagram of waveforms illustrating the operation of the power supply of FIG. 3 showing an asynchronous charging current conducted through an output capacitor of the power supply.
Figure 4B:
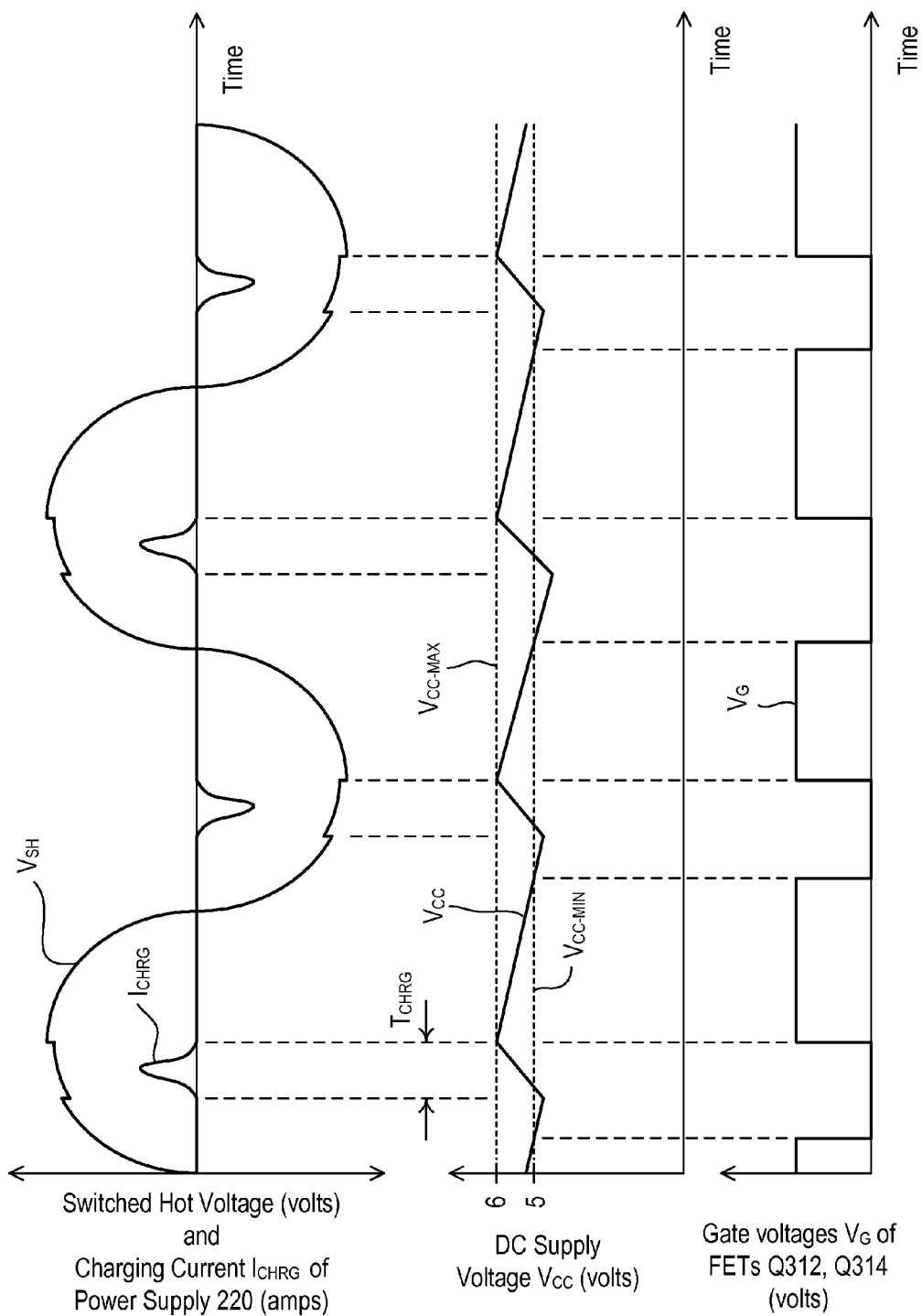
FIG. 4B is a simplified diagram of waveforms illustrating the operation of the power supply of FIG. 3 showing a synchronous charging current conducted through the output capacitor of the power supply.

FIG. 4A is a simplified diagram of example waveforms illustrating the operation of the on-state power supply 220 when the lighting load 104 is a resistive load, such as an incandescent lamp, and the charging current $I_{CHRG}$ is asynchronous with respect to the frequency of the AC power source 102. While the FETs Q312, Q314 are non-conductive, the DC supply voltage $V_{CC}$ increases in magnitude (from the minimum supply voltage $V_{CC-MIN}$ to the maximum supply voltage $V_{CC-MAX}$) during a charging time $T_{CHRG}$. During the charging time $T_{CHRG}$, the scaled voltage at the positive terminal of the comparator U332 (which is representative of the magnitude of the DC supply voltage $V_{CC}$) is less than the reference voltage of the shunt regulator D338 at the negative terminal. When the magnitude of the DC supply voltage $V_{CC}$ exceeds the maximum supply voltage $V_{CC-MAX}$, the output of the comparator U332 is driven high towards the DC supply voltage $V_{CC}$ and the FETs Q312, Q314 are rendered conductive (as shown by the gate voltages $V_G$ in FIG. 4A). At this time, the voltage at the positive terminal of the comparator U332 is pulled high towards the DC supply voltage $V_{CC}$. Since the FETs Q312, Q314 are conductive, the magnitude of the DC supply voltage $V_{CC}$ and the magnitude of the scaled voltage at the negative terminal of the comparator U332 begin to decrease as the controller 214 and other low-voltage circuits of the electronic switch 110 draw current from the output capacitor $C_{OUT}$.

When the magnitude of the DC supply voltage $V_{CC}$ drops below the minimum supply voltage $V_{CC-MIN}$, the scaled voltage at the positive terminal of the comparator U332 becomes less than the reference voltage of the shunt regulator D338 at the negative terminal. The output of the comparator U332 is driven low towards circuit common, and the FETs Q312, Q314 are rendered non-conductive, thus allowing the output capacitor $C_{OUT}$ to charge and the DC supply voltage $V_{CC}$ to increase in magnitude during the charging time $T_{CHRG}$. As a result of the operation of the power supply 220, only a low-voltage drop (i.e., approximately five volts) is developed across the power supply and the switched hot voltage $V_{SH}$ has only small "notches" (i.e., small changes in magnitude) when the output capacitor $C_{OUT}$ is charging as shown in FIG. 4A. Note that the worst case charging time $T_{CHRG}$ may be equal to approximately the period $T_{HC}$ of a half cycle of the AC power source 102 if the output capacitor $C_{OUT}$ charges and discharges such that the magnitude of the DC supply voltage $V_{CC}$ does not exceed the maximum supply voltage $V_{CC-MAX}$.

FIG. 4B is a simplified diagram of example waveforms illustrating the operation of the on-state power supply 220 when the load current $I_L$ is non-sinusoidal (e.g., the lighting load 104 is a compact fluorescent lamp), and the charging current $I_{CHRG}$ is synchronous with respect to the frequency of the AC power source 102. As shown in FIG. 4B, the charging current $I_{CHRG}$ does not immediately begin flowing when the magnitude of the DC supply voltage drops below the minimum supply voltage $V_{CC-MIN}$ even though the gate voltages $V_G$ are driven low and the FETs Q312, Q314 are rendered non-conductive. The charging current $I_{CHRG}$ begins flowing when the lighting load 104 begins conducting the load current $I_L$, which occurs at approximately the same time each half cycle, such that the charging current $I_{CHRG}$ is symmetric with respect to the frequency of the AC power source 102. Once again, only a low-voltage drop is developed across the power supply 220 and the switched hot voltage $V_{SH}$ has only small notches when the output capacitor $C_{OUT}$ is charging as shown in FIG. 4B.

Referring back to FIG. 3, the feedback control signal $V_{FB}$, which is provided to the controller 214, is generated at the collector of the transistor Q345. Thus, the feedback control signal $V_{FB}$ is the inverse of the gate voltage $V_G$ shown in FIGS. 4A and 4B. When the transistor Q345 is conductive (i.e., the FETs Q312, Q314 are conductive and the output capacitor $C_{OUT}$ is discharging), the feedback control signal $V_{FB}$ is driven low towards circuit common (i.e., a logic low level). When the transistor Q345 is non-conductive (i.e., the FETs Q312, Q314 are non-conductive and the output capacitor $C_{OUT}$ is charging), the feedback control signal $V_{FB}$ is pulled up towards the DC supply voltage $V_{CC}$ (i.e., a logic high level). When the controller 214 is ready to render the relay 210 conductive or non-conductive, the controller may wait until the feedback control signal $V_{FB}$ transitions from high to low (i.e., the magnitude of the DC supply voltage $V_{CC}$ is at the maximum supply voltage $V_{CC-MAX}$) before energizing either the SET coil or the RESET coil of the relay.

The controller 214 is operable to determine if the electronic switch 110 is overloaded (i.e., if an overload condition is occurring) in response to the charging time $T_{CHRG}$ required to charge the output capacitor $C_{OUT}$. For example, the electronic switch 110 may be overloaded if the lighting load 104 causes the load current $I_L$ conducted through the relay 210 to have a magnitude of approximately eight amps. Specifically, the controller 214 is operable measure the length of the time period between the low-to-high and high-to-low transitions of the feedback control signal $V_{FB}$ (i.e., the length of the charging time $T_{CHRG}$ when the output capacitor $C_{OUT}$ is charging). As the magnitude of the load current $I_L$ increases, the charging time $T_{CHRG}$ required to charge the output capacitor $C_{OUT}$ decreases. Therefore, the controller 214 is operable to compare the time period between the low-to-high and high-to-low transitions of the feedback control signal $V_{FB}$ to a predetermined charging time threshold $T_{CHRG-TH}$ (e.g., approximately 85 μsec) to determine if an overload condition may be occurring. Specifically, the controller 214 determines that the overload condition is occurring in response to detecting that a percentage (e.g., 10%) of the charging times $T_{CHRG}$ are less than the predetermined charging time threshold, for example, if ten of the last one hundred time periods between the low-to-high and high-to-low transitions of the feedback control signal $V_{FB}$ are less than approximately 85 μsec. The controller 214 opens the relay 210 when the overload condition is detected. In addition, the controller 214 may blink the visual indicator 114 in response to detecting the overload condition.

Figure 5:
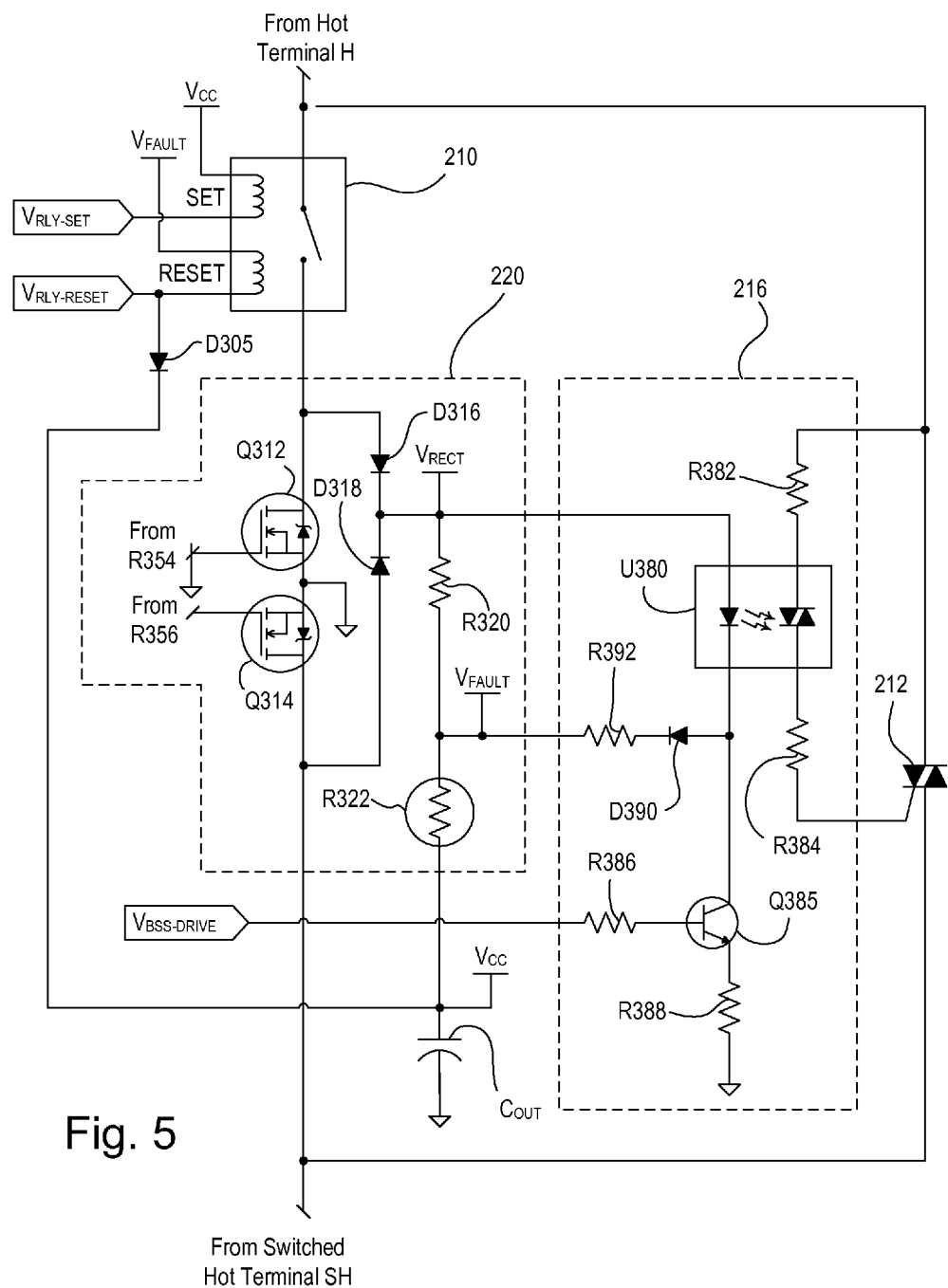
FIG. 5 is a simplified schematic diagram of a latching relay, a bidirectional semiconductor switch, a drive circuit, and the in-line on-state power supply of the two-wire electronic switch of FIG. 2.

FIG. 5 is a simplified schematic diagram showing how the in-line on-state power supply 220 is coupled to the latching relay 210 and the drive circuit 216 for the bidirectional semiconductor switch 212 to provide for fault detection and protection of the electronic switch 110. The SET coil of the relay 210 is coupled between the relay-set control signal $V_{RLY-SET}$ and the DC supply voltage $V_{CC}$. When the controller 214 drives the relay-set control signal $V_{RLY-SET}$ low to approximately circuit common, the mechanical switch of the relay 210 is rendered conductive. The RESET coil of the relay 210 is coupled between the relay-reset control signal $V_{RLY-RESET}$ and the fault voltage $V_{FAULT}$, which has a magnitude approximately equal to the magnitude of the DC supply voltage $V_{CC}$ during normal operating conditions (i.e., in absence of an over-temperature condition). The relay-reset control signal $V_{RLY-RESET}$ is also coupled to the DC supply voltage $V_{CC}$ through a diode D305. When the controller 214 drives the relay-reset control signal $V_{RLY-RESET}$ low to approximately circuit common during normal operating conditions, the mechanical switch of the relay 210 is rendered non-conductive.

If the output capacitor $C_{OUT}$ were to fail shorted when the latching relay 210 is conductive, the temperatures of the FETs Q312, Q314 of the on-state power supply 220 may increase to undesirable levels. According to an aspect of the present invention, when an over-temperature condition is detected in the FETs Q312, Q314 of the on-state power supply 220, the electronic switch 110 controls the latching relay 210 (e.g., to open the relay) in order to remove the over-temperature condition. Specifically, the PTC thermistor R322 is thermally coupled to the FETs Q312, Q314, such that the resistance of the PTC thermistor increases as the combined temperature of the FETs increases during the over-temperature condition, thus causing the fault voltage $V_{FAULT}$ to increase in magnitude. Since the series combination of the diode D305 and the RESET coil of the relay 210 is coupled between the fault voltage $V_{FAULT}$ and the DC supply voltage $V_{CC}$ (i.e., in parallel with the output PTC thermistor R322), current begins to flow through the RESET coil as the resistance of the PTC thermistor increases and the magnitude of the fault voltage $V_{FAULT}$ increases. The relay 210 is rendered non-conductive when the combined temperature of the FETs Q312, Q314 increases above a predetermined temperature threshold $T_{FAULT}$ (e.g., approximately 90° F.). In other words, the relay 210 is rendered non-conductive when the fault voltage $V_{FAULT}$ increases such that the voltage across the RESET coil renders the relay 210 non-conductive. Accordingly, the current through the FETs Q312, Q314 is controlled to zero amps and the fault condition is removed (i.e., the temperatures of the FETs will decrease below the undesirable levels). The relay 210 is rendered conductive in response to the over-temperature condition independent of the magnitude of the relay-reset control signal $V_{RLY-RESET}$. In addition, the relay 210 could be rendered conductive in response to an over-temperature condition in other circuits of the electronic switch 110.

As shown in FIG. 5, the bidirectional semiconductor switch 212 is implemented as a triac. The drive circuit 216 comprises an optocoupler U380 having an output phototriac coupled in series with the gate of the bidirectional semiconductor switch 212. When the output phototriac of the optocoupler U380 is conductive, the output phototriac conducts a gate current through two resistors R382, R384 each half cycle of the AC power source 102, thus rendering the bidirectional semiconductor switch 216 conductive each half cycle. The resistors R382, R384 may both have, for example, resistances of approximately 100 Ω.

The optocoupler U380 also has an input photodiode having an anode coupled to the rectified voltage $V_{RECT}$ of the on-state power supply 220. An NPN bipolar junction transistor Q385 is coupled in series with the input photodiode of the optocoupler U380. The controller 214 is coupled to the base of the transistor Q385 via a resistor R386 (e.g., having a resistance of approximately 1 kΩ). When the transistor Q385 is rendered conductive, the transistor conducts a drive current through the input photodiode of the optocoupler U380 and a resistor R388 (e.g., having a resistance of approximately 330Ω), thus rendering the output optotriac and the bidirectional semiconductor switch 212 conductive.

According to another aspect of the present invention, when an over-current condition is detected in the in-line on-state power supply 220, the electronic switch 110 uses the bidirectional semiconductor switch 212 to remove the over-current condition. The over-current condition may be caused by an inrush current conducted through the relay 210, for example, when the lighting load 104 is a capacitive load, such as a screw-in compact fluorescent lamp or an electronic low-voltage (ELV) lighting load. For example, the inrush current may have a magnitude greater than approximately three hundred amps and last for approximately two milliseconds as defined by the NEMA 410 Standard published by the National Electrical Manufacturers Association (NEMA). To protect the on-state power supply 220 from the over-current condition, the bidirectional semiconductor switch 212 is rendered conductive when the current through the over-current detect resistor R320 of the on-state power supply 220 exceeds a predetermined current threshold $I_{FAULT}$ (e.g., approximately forty amps). At this time, the voltage across the on-state power supply 220 is reduced to approximately the on-state voltage of the bidirectional semiconductor switch 212 (e.g., approximately one volt), which causes the power supply to stop charging the output capacitor $C_{OUT}$, and eliminates the over-current condition.

Referring back to FIG. 5, the over-current detect resistor R320 of the on-state power supply 220 is coupled in parallel with the series combination of the input photodiode of the optocoupler U380, a diode D390, and a resistor R392 (e.g., having a resistance of approximately 47Ω). When the current through the over-current detect resistor R320 exceeds the predetermined current threshold $I_{FAULT}$, the voltage generated across the series combination of the input photodiode of the optocoupler U380, the diode D390, and the resistor R392 causes the output phototriac of the optocoupler to be rendered conductive. Accordingly, the bidirectional semiconductor switch 212 is rendered conductive and the over-current condition is eliminated. Since the bidirectional semiconductor switch 212 is a triac, the bidirectional semiconductor switch becomes non-conductive at the end of the half cycle when the current through the bidirectional semiconductor switch drops to approximately zero amps. The bidirectional semiconductor switch 212 will be rendered conductive once again during the next half cycle if the over-current condition remains.

Figure 6:
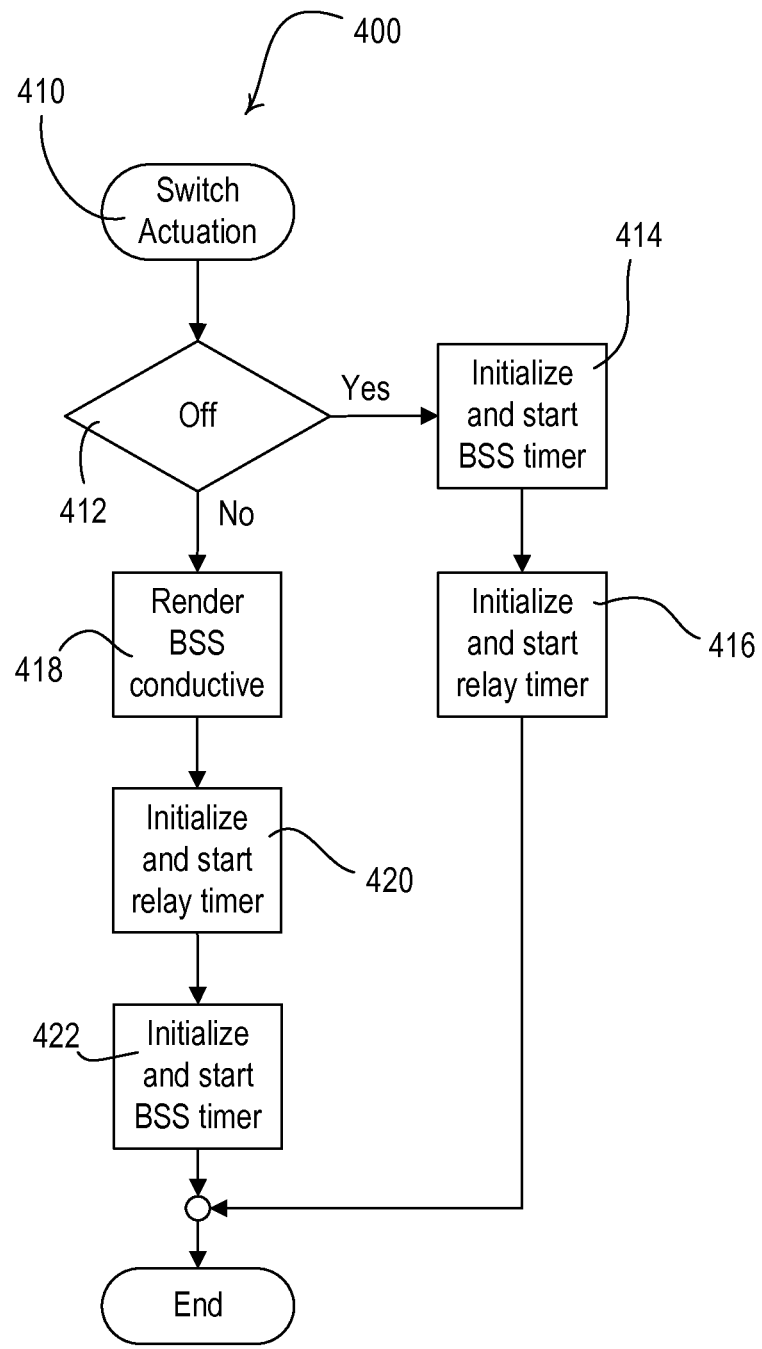
FIG. 6 is a simplified flowchart of a button procedure executed by a controller of the electronic switch of FIG. 2.

FIG. 6 is a simplified flowchart of a button procedure 400 executed by the controller 214 of the electronic switch 110 is response to an actuation of the switch S224 at step 410. The controller 214 uses two timers, e.g., a relay timer and a bidirectional semiconductor switch (BSS) timer, to control when the relay 210 and the bidirectional semiconductor switch 212 become conductive and non-conductive. When the relay timer expires, the controller 214 executes a relay timer procedure 600 to render the relay 210 conductive if the lighting load 104 is off and to render the relay non-conductive if the lighting load is on (as will be described in greater detail below with reference to FIG. 8). When the BSS timer expires, the controller 214 executes a BSS timer procedure 700 to control the bidirectional semiconductor switch 212 to become conductive if the lighting load 104 is off and to become non-conductive if the lighting load is on (as will be described in greater detail below with reference to FIG. 9). The controller 214 executes a received keypad message procedure (not shown), which is similar to the button procedure 400, in response to receiving an on command (when the on button 122 is actuated) and an off command (when the off button 124).

Referring to FIG. 6, if the lighting load 104 is off at step 412, the controller 214 initializes the BSS timer to a BSS-turn-on time $t_{BSS-ON}$, and starts the BSS timer decreasing in value with respect to time at step 414. The controller 214 then initializes the relay timer to a relay-turn-on time $t_{RLY-ON}$, and starts the relay timer decreasing in value with respect to time at step 416, before the button procedure 400 exits. For example, the BSS-turn-on time $t_{SS-ON}$ may be approximately zero milliseconds and the relay-turn-on time $t_{RLY-ON}$ may be approximately thirty milliseconds, such that the bidirectional semiconductor switch 212 will be rendered conductive before the relay 210 is rendered conductive. If the lighting load 104 is on at step 412, the controller 214 immediately renders the bidirectional semiconductor switch 212 conductive at step 418. The controller 214 then initializes the relay timer to a relay-turn-off time $t_{RLY-OFF}$, and starts the relay timer decreasing in value with respect to time at step 420. Finally, the controller 214 initializes the BSS timer to a BSS-turn-off time $t_{BSS-OFF}$, and starts the BSS timer decreasing in value with respect to time at step 422, before the button procedure 400 exits. For example, the relay-turn-off time $t_{RLY-OFF}$ may be approximately thirty milliseconds and the BSS-turn-off time $t_{BSS-OFF}$ may be approximately sixty milliseconds, such that the relay 210 will be rendered non-conductive before the bidirectional semiconductor switch 212 becomes non-conductive.

Figure 7:
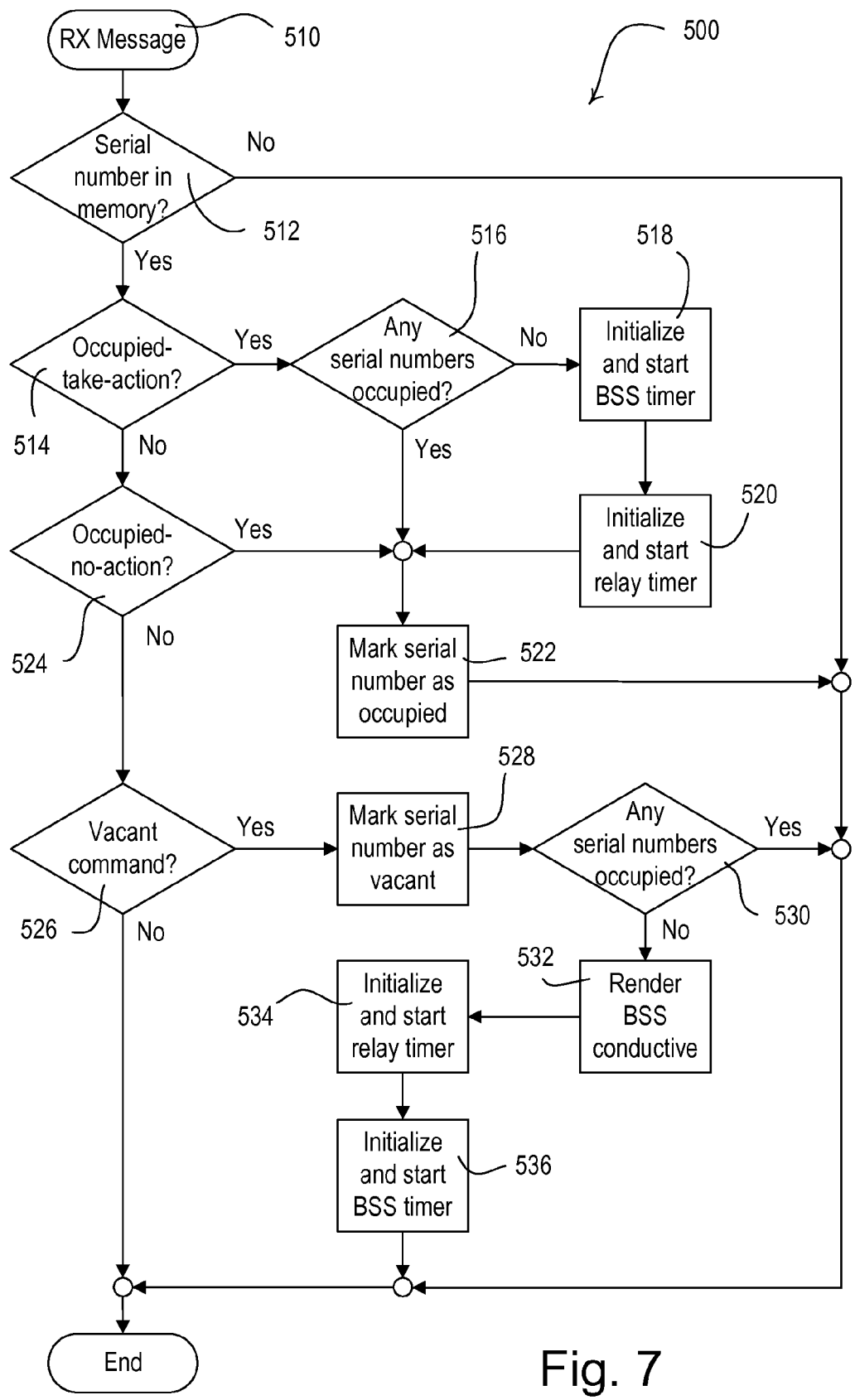
FIG. 7 is a simplified flowchart of a received message procedure executed by the controller of the electronic switch of FIG. 2.

FIG. 7 is a simplified flowchart of a received occupancy message procedure 500 executed by the controller 214 of the electronic switch 110 in response to receiving a digital message from one of the occupancy sensors 130 via the RF signals 106 at step 510. The controller 214 keeps track of the states of the occupancy sensor 130 to which the electronic switch 110 is assigned in response to the digital messages received from the occupancy sensors. Specifically, if the controller 214 receives an occupied-take-action command or an occupied-no-action command from an occupancy sensor 130, the controller marks the serial number of the occupancy sensor as "occupied" in the memory 228. If the controller 214 receives a vacant command from the occupancy sensor 130, the controller marks the serial number of the occupancy sensor as "vacant" in the memory 228. The controller waits for a vacant command from all of the occupancy sensors to which the electronic switch 110 is assigned before turning off the lighting load 104.

Referring to FIG. 7, after receiving the digital message at step 510, the controller 214 first determines whether the serial number provided in the received digital message is stored in the memory 228 at step 512. If not, the controller 214 does not process the received digital message and the received occupancy message procedure 500 exits. If the serial number of the received digital message is stored in the memory 228 at step 512 and the received digital message is an occupied-take-action command at step 514, the controller 214 determines if any of the serial numbers stored in the memory 228 are marked as occupied at step 516 to determine if the space is occupied or vacant. If there are no serial numbers marked as occupied at step 516 (i.e., the space has just become occupied), the controller 214 turns on the lighting load 104 by initializing and starting the BSS timer (using the BSS-turn-on time $t_{BSS-ON}$) at step 518, and initializing and starting the relay timer (using the relay-turn-on time $t_{RLY-ON}$) at step 520. The controller 214 then marks the serial number of the received digital message as occupied at step 522 and the received message procedure 510 exits. If there are serial numbers marked as occupied at step 516 (i.e., the space is occupied), the controller 214 marks the serial number of the received digital message as occupied at step 522, before the received occupancy message procedure 500 exits.

If the received digital message is an occupied-no-action command at step 524, the controller 214 does not adjust the amount of power delivered to the lighting load 104. The controller 214 simply marks the serial number as occupied at step 522 and the received occupancy message procedure 500 exits. If the received digital message is a vacant command at step 526, the controller 214 marks the serial number as vacant at step 528. If any of the serial numbers are still marked as occupied at step 530 (i.e., the space is still occupied), the received occupancy message procedure 500 simply exits. However, if all of the serial numbers are marked as vacant at step 530 (i.e., the space is now vacant), the controller 214 controls the lighting load 104 off by immediately rendering the bidirectional semiconductor switch 212 conductive at step 532, initializing and starting the relay timer (using the relay-turn-off time $t_{RLY-OFF}$) at step 534, and initializing and starting the BSS timer (using the BSS-turn-off time $t_{BSS-OFF}$) at step 536, before the received occupancy message procedure 500 exits.

Figure 8:
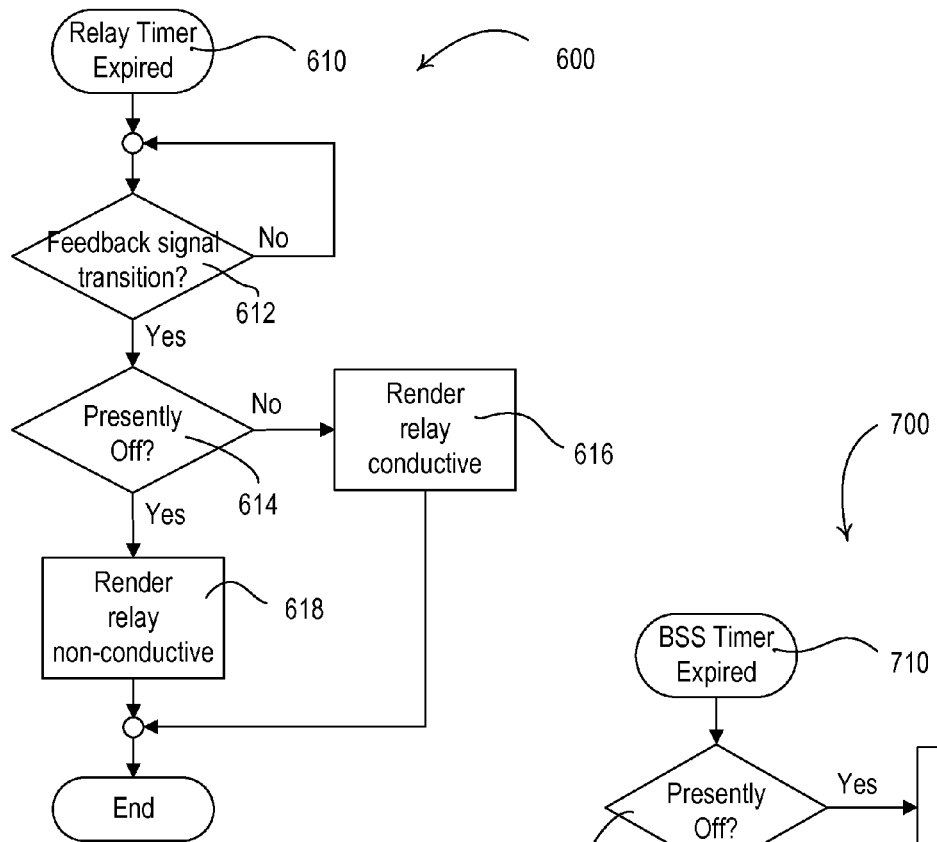
FIG. 8 is a simplified flowchart of a relay timer procedure executed by the controller of the electronic switch of FIG. 2.

FIG. 8 is a simplified flowchart of a relay timer procedure 600 executed by the controller 214 when the relay timer expires at step 610. First, the controller 214 waits until the feedback control signal $V_{FB}$ transitions from high to low at step 612 indicating that the magnitude of the DC supply voltage $V_{CC}$ is equal to the maximum supply voltage $V_{CC-MAX}$. When the controller 214 detects that the feedback control signal $V_{FB}$ has transitioned from high to low at step 612, the controller immediately renders the relay 210 conductive or non-conductive depending upon the present state of the lighting load 104. If the lighting load 104 is off at step 614, the controller 214 renders the relay 210 conductive at step 616 by conducting current through the SET coil of the relay and the relay timer procedure 600 exits. If the lighting load 104 is off at step 614, the controller 214 renders the relay 210 non-conductive at step 618 by conducting current through the RESET coil and the relay timer procedure 600 exits.

Figure 9:
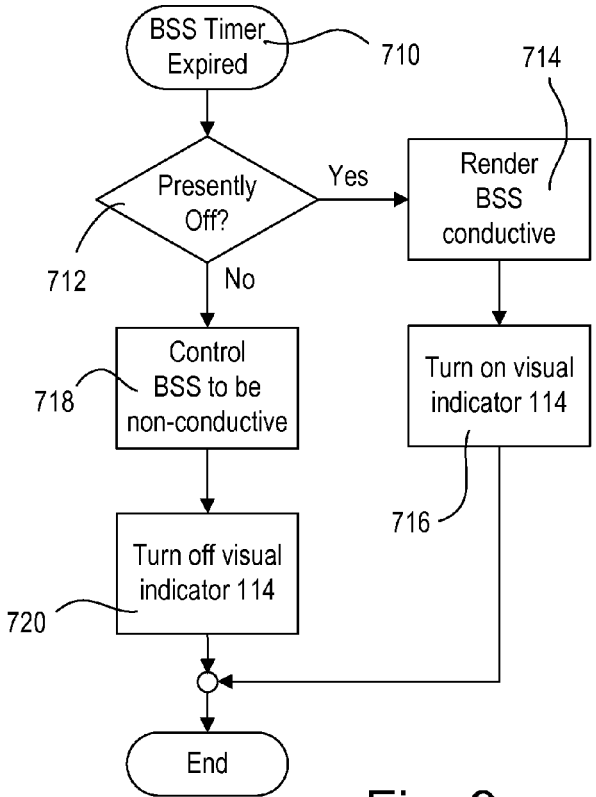
FIG. 9 is a simplified flowchart of a bidirectional semiconductor switch (BSS) timer procedure executed by the controller of the electronic switch of FIG. 2.

FIG. 9 is a simplified flowchart of a BSS timer procedure 700 executed by the controller 214 when the BSS timer expires at step 710. If the lighting load 104 is off at step 712, the controller 214 controls the drive circuit 216 to render the bidirectional semiconductor switch 212 conductive at step 714 and illuminates the visual indicator 214 at step 716, before the BSS timer procedure 700 exits. If the lighting load 104 is off at step 712, the controller 214 controls the drive circuit 216 such that the bidirectional semiconductor switch 212 becomes non-conductive at step 718. The controller 214 then controls the visual indicator 214 to be off at step 720 and the BSS timer procedure 700 exits.

Figure 10:
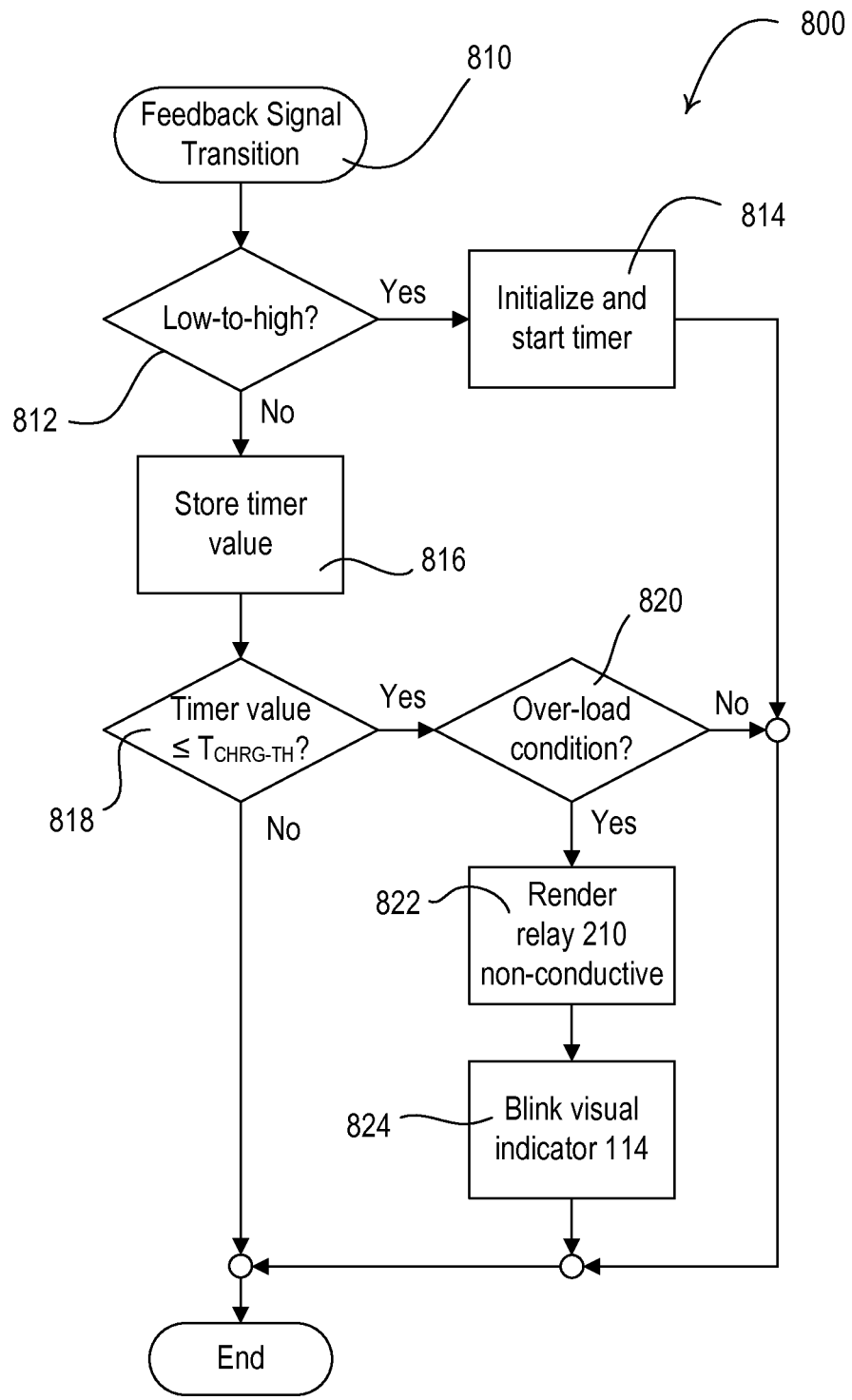
FIG. 10 is a simplified flowchart of an overload detection procedure executed by the controller of the electronic switch of FIG. 2.

FIG. 10 is a simplified flowchart of an overload detection procedure 800 executed by the controller 214 when the feedback control signal $V_{FB}$ transitions from high to low or low to high at step 810. If the detected transition of the feedback control signal $V_{FB}$ is a low-to-high transition at step 812, the controller 214 initializes a timer (e.g., to zero µtsec) and starts the timer increasing in value with respect to time at step 814, before the overload detection procedure 800 exits. If the detected transition of the feedback control signal $V_{FB}$ is a high-to-low transition at step 812, the controller 214 stores the present value of the timer at step 816. If the timer value is greater than the predetermined charging time threshold $T_{CHRG-TH}$ (i.e., approximately 85 µtsec) at step 818, the overload detection procedure 800 simply exits. However, if the timer value is less than or equal to approximately the predetermined charging time threshold $T_{CHRG-TH}$ at step 818, the controller 214 determines if an overload condition is occurring at step 820. Specifically, the controller 214 determines at step 820 if a percentage (e.g., 10%) of the most recently stored timer values (from step 816) are less than the predetermined charging time threshold, for example, if ten of the last one hundred stored timer values are less than approximately 85 µtsec. If the controller 214 does not detect the overload condition at step 820, the overload detection procedure 800 simply exits. Otherwise, if the controller 214 detects the overload condition at step 820, the controller 214 renders the relay 210 non-conductive at step 822 and blinks the visual indicator 114 at step 824, before the overload detection procedure 800 exits.

While the present invention has been described with reference to the electronic switch 110 controlling the power delivered to a connected lighting load, the concepts of the present invention could be used in any type of control device of a load control system, such as, for example, a dimmer switch for adjusting the intensity of a lighting load (such as an incandescent lamp, a magnetic low-voltage lighting load, an electronic low-voltage lighting load, and a screw-in compact fluorescent lamp), a remote control, a keypad device, a visual display device, a controllable plug-in module adapted to be plugged into an electrical receptacle, a controllable screw-in module adapted to be screwed into the electrical socket (e.g., an Edison socket) of a lamp, an electronic dimming ballast for a fluorescent load, and a driver for a light-emitting diode (LED) light source, a motor speed control device, a motorized window treatment, a temperature control device, an audio/visual control device, or a dimmer circuit for other types of lighting loads, such as, magnetic low-voltage lighting loads, electronic low-voltage lighting loads, and screw-in compact fluorescent lamps.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A two-wire electronic switch adapted to be coupled between an AC power source and an electrical load for turning the electrical load on and off, the electronic switch comprising:
   a controllably conductive device adapted to be coupled in series electrical connection between the source and the load, the controllably conductive device adapted to conduct a load current through the load when the controllably conductive device is conductive;
   a controller operatively coupled to the controllably conductive device for controlling the controllably conductive device to be conductive and non conductive to turn the load on and off, respectively;
   an output capacitor operable to develop a DC supply voltage for powering the controller; and
   an in-line power supply coupled in series with the controllably conductive device, the in-line power supply further coupled to the output capacitor for controlling when the output capacitor charges in order to generate the DC supply voltage across the output capacitor when the controllably conductive device is conductive, such that the output capacitor stops charging when the magnitude of the DC supply voltage reaches a maximum DC supply voltage threshold, a voltage developed across the in-line power supply when the output capacitor is charging having a substantially small magnitude as compared to a peak voltage of an AC line voltage of the AC power source, the output capacitor adapted to conduct the load current for at least a portion of a line cycle of the AC power source when the controllably conductive device is conductive;
   wherein the in-line power supply controls when the output capacitor charges asynchronously with respect to the frequency of the AC power source, such that the output capacitor is operable to start and stop charging at any time during each half cycle, the power supply operable to start and to stop charging the output capacitor at least once during each half cycle of the AC power source; and
   wherein the controller is operable to determine when the magnitude of the DC supply voltage reaches the maximum DC supply voltage threshold, and to render the controllably conductive device non-conductive immediately after the DC supply voltage reaches the maximum DC supply voltage threshold.

2. The electronic switch of claim 1, wherein the controllably conductive device comprises a relay.

3. The electronic switch of claim 2, wherein the power supply comprises a first bidirectional semiconductor switch coupled in series with the relay and in parallel with the output capacitor, such that the output capacitor is operable to charge when the relay is conductive and the first bidirectional semiconductor switch is non conductive.

4. The electronic switch of claim 3, wherein the power supply further comprises a control circuit coupled to the first bidirectional semiconductor switch for rendering the first bidirectional semiconductor switch conductive and non-conductive, the control circuit responsive to the magnitude of the DC supply voltage to render the first bidirectional semiconductor switch conductive when the magnitude of the DC supply voltage reaches the maximum DC supply voltage threshold.

5. The electronic switch of claim 4, wherein the control circuit of the power supply is operable to render the first bidirectional semiconductor switch non-conductive when the magnitude of the DC supply voltage drops to a minimum DC supply voltage threshold.

6. The electronic switch of claim 5, wherein the controller is operable to measure a charging time required to charge the output capacitor, and to determine if an overload condition is occurring if the length of the charging time is less than a predetermined charging time threshold.

7. The electronic switch of claim 1, further comprising:
an off-state power supply coupled in parallel with the series combination of the relay and the in-line power supply, the off-state power supply coupled to the output capacitor for controlling when the output capacitor charges to generate the DC supply voltage across the output capacitor when the lighting load is off.

8. The electronic switch of claim 7, further comprising:
a communication circuit coupled to the controller, such that the controller is operable to turn the lighting load on and off in response to digital messages received via the communication circuit.

9. The electronic switch of claim 8, wherein the communication circuit comprises an RF transceiver.

10. The electronic switch of claim 7, wherein the off-state power supply comprises an isolated power supply.

11. The electronic switch of claim 1, further comprising:
a communication circuit coupled to the controller, such that the controller is operable to receive digital messages.

12. The electronic switch of claim 11, wherein the communication circuit comprises an RF transceiver.

13. The electronic switch of claim 11, wherein the communication circuit comprises an RF receiver.

14. The electronic switch of claim 11, wherein the communication circuit comprises an IR receiver.

15. The electronic switch of claim 1, further comprising:
an occupancy detection circuit for detecting the presence of an occupant in the space around the electronic switch;
wherein the controller is operable to turn the lighting load on in response to the occupancy detection circuit detecting the presence of the occupant.

16. The electronic switch of claim 1, wherein the output capacitor begins to charge when the magnitude of the DC supply voltage drops to a minimum DC supply voltage threshold and stops charging when the magnitude of the DC supply voltage rises to a maximum DC supply voltage threshold.

17. The electronic switch of claim 1, wherein the in-line power supply does not comprise a transformer.

18. A two-wire electronic switch for controlling the power delivered from an AC power source to an electrical load, the electronic switch comprising:
a latching relay adapted to be coupled in series electrical connection between the source and the load for turning the load on and off;
a controller operatively coupled to the relay for turning the load on and off;
an output capacitor operable to develop a DC supply voltage for powering the controller; and
an in-line power supply coupled in series electrical connection with the relay, the in line power supply further coupled to the output capacitor for generating the DC supply voltage across the output capacitor when the relay is conductive, the power supply comprising a bidirectional semiconductor switch coupled in series with the relay and in parallel with the output capacitor, such that the output capacitor is operable to charge when the relay is conductive and the bidirectional semiconductor switch is non conductive, the bidirectional semiconductor switch rendered conductive when the magnitude of the DC supply voltage reaches a maximum DC supply voltage threshold and rendered non-conductive when the magnitude of the DC supply voltage drops to a minimum DC supply voltage threshold, the output capacitor adapted to conduct the load current for at least a portion of a line cycle of the AC power source when the relay is conductive;
wherein the controller is operable to determine when the magnitude of the DC supply voltage reaches the maximum DC supply voltage threshold, and to render the relay non-conductive immediately after the DC supply voltage reaches the maximum DC supply voltage threshold.

* * * * *